(12) United States Patent
Prodic et al.

(10) Patent No.: US 8,487,600 B2
(45) Date of Patent: Jul. 16, 2013

(54) CONTINUOUS-TIME DIGITAL CONTROLLER FOR HIGH-FREQUENCY DC-DC CONVERTERS

(76) Inventors: Aleksandar Prodic, Toronto (CA); Zhenyu Zhao, Toronto (CA)

( * ) Notice: Subject to any disclaimer, the term of this patent is extended or adjusted under 35 U.S.C. 154(b) by 1040 days.

(21) Appl. No.: 12/100,556

(22) Filed: Apr. 10, 2008

(65) Prior Publication Data

US 2008/0252280 A1 Oct. 16, 2008

Related U.S. Application Data

(60) Provisional application No. 60/910,839, filed on Apr. 10, 2007.

(51) Int. Cl.
*G05F 1/575* (2006.01)
(52) U.S. Cl.
USPC .............................. 323/283; 341/159; 700/75
(58) Field of Classification Search
USPC ........... 323/283; 700/42, 44, 75, 78; 341/159; 332/108–110
See application file for complete search history.

(56) References Cited

U.S. PATENT DOCUMENTS

| 6,933,709 B2* | 8/2005 | Chapuis ........................ 323/282 |
| 6,965,502 B2* | 11/2005 | Duffy et al. ..................... 361/18 |
| 2006/0152204 A1* | 7/2006 | Maksimovic et al. ........ 323/284 |
| 2006/0227861 A1* | 10/2006 | Maksimovic et al. ........ 375/238 |

* cited by examiner

*Primary Examiner* — Harry Behm
(74) *Attorney, Agent, or Firm* — Norton Rose Canada, LLP

(57) ABSTRACT

The present invention is a voltage mode digital controller for low-power high-frequency dc-dc converters that has recovery time approaching physical limitations of a given power stage. It consists of a digital controller with load transient response approaching physical limitations of a given power stage that is suitable for low-power SMPS. In one aspect the invention is a method of utilizing a continuous-time digital signal processor (CT-DSP) for regulation of the operation of switch-mode power supplies. A CT-DSP can be used to instantaneously detect changes of voltage or current during transition periods and immediately perform control action that results in the fastest possible response. The invention may include current program mode controllers for SMPS where the input current is sensed as well as power factor correction rectifiers (PFC), where often input voltage, input current and output voltage are sensed. Upon sensing a deviation in the input voltage the CT-DSP is utilized to apply a switch-mode power operation whereby the controller switches between continuous-time and digital function.

10 Claims, 11 Drawing Sheets

CONTINUOUS-TIME DIGITAL CONTROLLER FOR HIGH-FREQUENCY DC-DC CONVERTERS

This application claims the benefit of U.S. Provisional Patent Application No. 60/910,839, filed Apr. 10, 2007.

FIELD OF THE INVENTION

The present invention relates in general to the regulation of dc-dc switched-mode power supplies. The present invention also relates in general to the field of digital and mixed signal controllers.

BACKGROUND OF THE INVENTION

Reference to background documents refers to the "List of References" provided below.

Fast response to load transients and other disturbances as well as tight output voltage regulation are among the most important requirements in modern low-power dc-dc switch-mode power supplies (SMPS)[1], processing power that may range from a fraction of watt to several hundreds of watts. Few of many advantages of the fast transient response are listed here. In cost-sensitive point-of-load (POL) applications and portable systems, improvements in the load transient response usually result in a substantial reduction of the size and weight of the costly power stage filter components [2], for example the filter inductor and output capacitor. In distributed power systems (DPS) for personal computers and telecom, the faster control also reduces voltage and current stress on downstream converters providing more reliable operation of the supplied equipment.

Even though numerous fast transient response methods have been developed [3]-[22], in most commercial low-power SMPS, predominantly analog voltage mode pulse-width modulation (PWM) or current-program mode regulators with limited bandwidth of the voltage loop [23], [24] are used. Among the main reasons for this are the elements of the system of operation at a constant switching frequency minimizing noise problems, tight output voltage regulation, and simple cost-effective practical implementation [1].

Fast transient response methods based on various modifications of voltage-mode hysteretic control [4], [5], including those with variable hysteretic band [25] for achieving constant switching frequency, have proven to be viable for some applications. Still, in the targeted systems their use is often limited. There are several reasons for this limited use such as, for example, the voltage mode hysteretic control cannot directly be applied for boost converters [25], while in buck topologies it can compromise voltage regulation. This is because the SMPS behaves as a second-order system and a delay between the switching action and actual increase/decrease of the output voltage always exists. As a solution, current mode hysteretic controllers have been proposed [6].

Current mode hysteretic controllers can eliminate the previously mentioned problems but their practical realization is challenging. Similar to switching surface [7]-[10] and trajectory path [22]-[23] methods, these controllers often require measurement of the output capacitor current and/or a costly high gain-bandwidth current amplifying circuit. Since the complexity of these systems significantly exceeds that of a complete conventional PWM controller [1], they have not been widely adopted in high-frequency low-power SMPS.

In [11] and [22] it has been shown that for a given converter topology an optimal-time transient response can be obtained through a single on/off action of the power switches, where the on and off times are calculated based on the output capacitor charge balance [5], [7]-[9], [11]-[16]. This fast voltage recovery mechanism has been verified through simulations and through analog implementation capable of operating for a single predefined load change. No attempt has been made to create a practical system capable of operating over a wide operating range. This may be due to the requirement for a relatively complex calculation to achieve an optimal switching sequence, including on and off transistor times, which cannot be easily realized with analog hardware.

A more practical implementation, achieving optimal response for a wide range of voltage reference changes and a fast but still sub-optimal response for the load variations, has also been suggested [12]. It combines linear and nonlinear control utilizing both analog and digital circuits. The digital hardware ensures optimal response time for the voltage reference changes. In this case, the optimal switching sequences for different references are pre-calculated and stored in look-up tables. During load transients that are usually unknown the presented controller applies constant-frequency analog hysteretic control, relying on the indirect output capacitor current measurements.

A fully-digital optimal-time controller shown in [13]-[16] is well suited for converters processing larger power than the systems targeted in this invention. By using superior flexibility and computational power of a digital processor, the proposed current-program mode implementation performs on-line calculations of the switching sequence resulting in the optimal response for various loads. In this solution the fast transient response comes at the price of fairly complex controller hardware. The practical realization of this solution can be costly. It requires a fairly powerful processor, a high-gain bandwidth current sensing/amplifying circuit and three high-sampling rate analog-to-digital converters (ADC). Hence, in emerging digital controllers for low-power SMPS, digital equivalents of analog voltage mode PWM controllers [26] are still preferred and implemented over other solutions as hardware simplicity is one of the key user requirements.

In recent years digital PWM controllers for low-power SMPS have appeared as an alternative to analog systems. They offer advanced features, such as auto-tuning [27]-[29], multi-mode operation, fault-tolerant operation, design flexibility, and design portability. However, due to the sampling effect and inherent delays of digital systems, at the very best, the digital PWM controllers have dynamic characteristics slower than their analog counterparts. The slower response of the digital systems results in significantly larger and more expensive power stage components, which in most cases completely nullify all of the abovementioned advantages of digital control.

In light of the foregoing, what is needed is a digital controller with load transient response approaching physical limitations of a given power stage that is suitable for low-power SMPS. It should be realized with fairly simple components, allowing full utilization of the advantages of digital implementation without introducing a significant hardware overhead. Such a digital controller should further be able to eliminate the delay-related problems of digital systems.

In the present invention we present a solution for this problem, relying upon the use of a simple continuous-time digital signal processor (CT-DSP) [30]-[33], which executes an algorithm for the optimal-time output voltage recovery. The algorithm applied may rely on the capacitor charge balance principle [5], [7]-[9], [11], [13] and utilize detection of the peak/valley point of the output voltage deviation to eliminate the need for a costly current sensing/amplifying circuit [34].

SUMMARY OF THE INVENTION

In one aspect of the invention a continuous-time digital controller system for regulating output of digitally controlled dc-dc switch-mode power supplies is disclosed comprising: one or more connections to an output; a continuous-time digital signal processor; a compensator; and one or more controllers; wherein one or more of the one or more controllers sense the output and transfers the output to the continuous-time digital signal processor which reacts to a deviation in the output whereby function of the continuous-time digital signal controller may switch between continuous-time and digital and this switch is passed to the compensator, which in turn controls the one or more controllers.

In another aspect of the invention a method for obtaining optimal response in a switch-mode power controller is disclosed comprising the steps of: sensing of an output capacitor voltage by a mode controller; processing of a signal relational to the output capacitor voltage passed from the mode controller to a continuous-time digital signal processor comprising: an asynchronous windowed flash analog-to-digital converter; one or more delay cells; and digital logic; capturing and storing output capacitor voltage data in the one or more delay cells; utilizing the digital logic and delay cells to indicate the output capacitor voltage deviation; executing an optimal-time voltage output recovery algorithm by the continuous-time digital signal processor when an output capacitor voltage deviation occurs to cause recovery activity whereby the controller switches between digital and continuous-time.

In yet another aspect of the invention a continuous-time digital controller for low-power high-frequency dc-dc converters is disclosed comprising: one or more connections to an output; a continuous-time digital signal processor comprising: an asynchronous windowed flash analog-to-digital converter; one or more delay cells; and digital logic; a compensator; and one or more controllers; wherein one or more of the one or more controllers sense the output and transfers the output to the continuous-time digital signal processor which reacts to a deviation in the output whereby function of the continuous-time digital signal controller may switch between continuous-time and digital and this switch is passed to the compensator, which in turn controls the one or more controllers.

In another aspect of the invention a dual-mode controller system is disclosed comprising two modes of function including: a steady state; and a dynamic state; wherein in the steady state a conventional PID regulator is used to obtain tight output regulation; wherein in the dynamic state a continuous-time digital signal processor principle is utilized for achieving optimum control; wherein the steady and dynamic states are affected by a monitoring means that monitors an input feed on an on-going basis and the steady state is the state of the controller as long as the input feed remains constant; wherein the controller applies a mode-switch when a deviation in the input feed is recognized by the monitoring means whereby the steady state is replaced by the dynamic state which activates a mode-switch.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

BRIEF DESCRIPTION OF THE DRAWINGS

A detailed description of the preferred embodiment(s) is (are) provided herein below by way of example only and with reference to the following drawings, in which.

Figure 1:
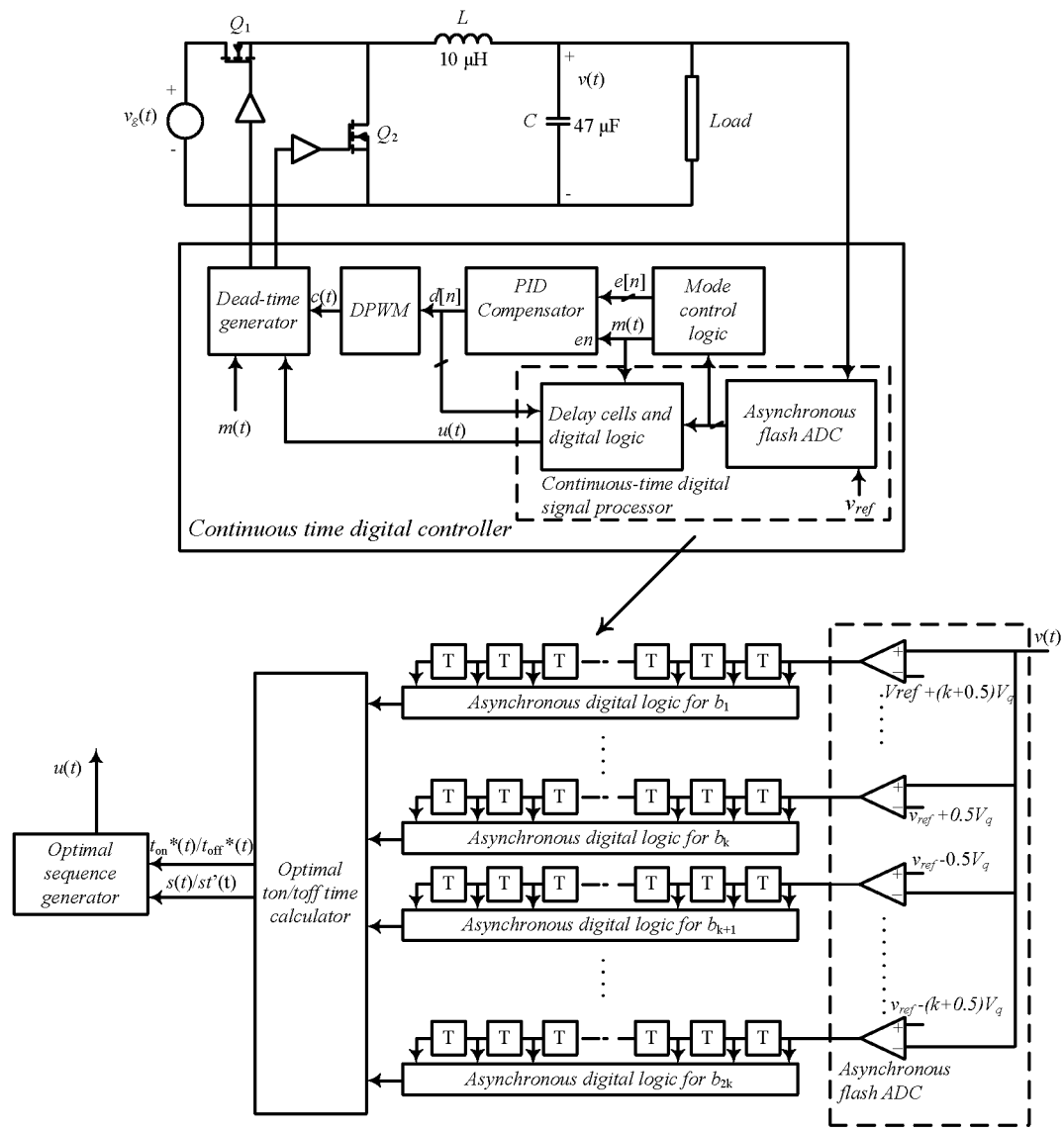
FIG. 1 illustrates a continuous-time digital controller applicable to regulate the operation of a buck converter and a simplified structure of the continuous-time digital signal processor (CT-DSP) used for fast voltage recovery.

In the drawings, embodiments of the invention are illustrated by way of example. It is to be expressly understood that the description and drawings are only for the purpose of illustration and as an aid to understanding, and are not intended as a definition of the limits of the invention.

DETAILED DESCRIPTION OF THE INVENTION

The present invention is a voltage mode digital controller for low-power high-frequency dc-dc converters that has recovery time approaching physical limitations of a given power stage. It consists of a digital controller with load transient response approaching physical limitations of a given power stage that is suitable for low-power SMPS.

The present invention, in one aspect, is a method of utilizing a continuous-time digital signal processor (CT-DSP) for regulation of the operation of switch-mode power supplies. More specifically, a CT-DSP can be used to instantaneously detect changes of voltage or current during transition periods and immediately perform control action that results in the fastest possible response. In one embodiment of the present invention the output voltage of the SMPS is controlled. Alternatively, the output or input current of an SMPS can be regulated using the same principle. A skilled reader will recognize that the invention may include, but is not limited to, current program mode controllers for SMPS where the input current is sensed as well as power factor correction rectifiers (PFC), where often input voltage, input current and output voltage are sensed.

In the embodiment of the present invention, the signal captured with the CT-DSP structures is processed in a manner involving multiple aspects. First, the output voltage control may yield, due to the detection of the voltage valley point such as its magnitude and time instant, the exact moment when the output current equals the inductor current. Such information can be used to determine optimum on and off times of the switching transistors controlling the power flow.

The abovementioned CT-DSP structure may be used to improve the response speed of SMPS controllers by eliminating the inherent delay of conventional PID compensators. In existing controllers a traditional PID detects output voltage change with a certain delay, after a periodic sample of the output is taken. In addition, the processing of the sample may often take a certain amount of time and a strong reaction of the compensator delayed by several switching cycles. This consequent delay can result in overly large voltage variations at the output of power converter, which, in turn, require the converter to be over designed, and in many cases, a downstream dc-dc stage as well. Additionally, the slow response of the controller may cause output voltage to overshoot or undershoot damaging or disabling supplied devices.

The CT-DSP based controller of the present invention can detect the transient upon the triggering of any of its comparators. At the point of triggering, or near to the point of triggering, the exact output voltage may be sensed and processed instantly, or close to instantly, by combinational logic so that proper control actions can be taken immediately or near-immediately. As the FIR filter example of [30]-[31] shows, CT-DSP not only can detect the transient in the shortest possible time, due to the presence of delay cells behaving as memory elements, it can also preserve past data. The current and past data stored in delay cells allow the processing of quantized signals in digital domain.

As an example, an implementation of the method of the present invention for the regulation of the output voltage of a buck converter is shown in FIG. 1. In this embodiment of the present invention the controller operates in two modes. In steady state it can provide tight output voltage regulation and operation at constant switching frequency by operating as a conventional digital PID-based pulse-width modulated controller, i.e. DPWM controller. During transients, a continuous-time digital control unit (CT-DCU) may be used to achieve very fast dynamic responses. The CT-DCU can detect load transients instantly and calculates a switching action that transistors SW1 and SW2 need to perform, such as, for example, optimum switching time, to reach the steady state in the fastest possible time, limited by the physical constraint of the converter, such as, for example, values of L and C. The calculation may be based on capacitor charge balance principle. In this embodiment, instead of using a general purpose processor for calculation of the optimum times, look-up tables that store pre-calculated optimum time values may be utilized. A skilled reader will recognize that alternative implementations using application specific or general purpose processors for calculating optimal on and off times are also possible. It should also be noted that embodiments of the present invention may eliminate the need for costly current sensing, allowing the digital controller to be used in low power SMPS.

The present invention may be realized with fairly simple components, and thereby allow full utilization of the advantages of digital implementation without introducing significant hardware overhead. The digital controller of the present invention may further be able to eliminate the delay-related problems of digital systems by using a simple CT-DSP [30]-[33], which executes an algorithm for the optimal-time output voltage recovery. The algorithm may rely on the capacitor charge balance principle [5], [7]-[9], [11], [13] and utilize detection of the peak/valley point of the output voltage deviation to eliminate the need for a costly current sensing/amplifying circuit [34].

In another embodiment, the present invention may be a voltage mode digital controller for low-power high-frequency dc-dc converters that has recovery time approaching physical limitations of a given power stage. To achieve such a quick response, during transients the controller may utilize an asynchronous windowed flash analog-to-digital converter, delay lines, and digital logic forming an application specific CT-DSP, as shown in FIG. 1. The CT-DSP can process signals that are continuous in time and have quantized magnitude to exploit advantages of both digital and analog worlds.

By eliminating sampling, characteristic for conventional digital systems, the aliasing and delay problems may be eliminated allowing for an increase in processing speed. On the other hand, the quantization in amplitude makes advanced data processing, a main advantage of digital implementation, possible.

In one embodiment of the present invention, to eliminate the need for current measurement, and consequently, significantly simplify the system implementation, the CT-DSP may implement a capacitor-charge balance based algorithm. Based on the maximum amplitude of voltage deviation and its time instant, the algorithm may calculate the optimal on and off times of the power switch resulting in virtually the fastest recovery time possible. To further ease the hardware requirements a digital error correction, minimizing the magnitude quantization effects and compensating for delays in the system, may be applied. To test this embodiment of the present invention a FPGA-based controller prototype was built and tested with a low-power dc-dc converter operating at 400 kHz switching frequency. The experimental results reflect a fast recovery time. Limitations upon the recovery time shown by the test include the values of the power stage inductor and capacitor.

System Description

As shown in FIG. 1, a continuous-time digital controller can regulate the operation of a buck converter whereby a simplified structure of the CT-DSP may be used for voltage recovery, including fast voltage recovery. In one embodiment of the present invention the continuous-time digital controller may have two distinctive modes of output voltage regulation. In steady-state it may operate as a conventional digital PWM regulator producing signal c(t). Every $T_{sw}=1/f_{sw}$, where $f_{sw}$ is the switching frequency, the PID compensator may calculate a new value d[n], controlling the digital pulse-width modulator (DPWM), according to:

$$d[n]=d[n-1]+Ae[n]+Be[n-1]+Ce[n-2] \quad (1)$$

where, e[n], e[n−1], and e[n−2] are digital equivalents of the present value of the output voltage error, and the errors of one and two switching cycles before, respectively. The coefficients A, B, and C may set the compensator gain and zeroes [35].

In one embodiment, as soon as a transient of the output voltage occurs, without waiting for any clock signal, the mode control logic can detect the deviation and switch the system into dynamic mode. The CT-DSP of this controller can consist of a set of asynchronous comparators forming a windowed flash analog-to-digital converter (ADC), delay cells with a very short propagation time $T \ll T_{sw}$, and asynchronous digital logic. In one embodiment of the present invention the CT-DSP may be application-specific. In another embodiment of the present invention the CT-DSP may start recovering the output voltage.

In yet another embodiment of the present invention the CT-DSP may utilize the general concept of the real-time processing of quantized analog signals in the digital domain, introduced by Tsividis [30]-[33]. This concept makes use of key properties in both analog and digital signal processing. It combines the superior speed of analog implementation with the flexibility and computational power offered by digital hardware. In such an embodiment, any change at the input of the CT-DSP asynchronous digital logic may be sensed, the states of the input signal amplitude and time instants can be captured and processed in the digital domain.

The lack of synchronous sampling eliminates the aliasing effect that can limit several elements of the controller, such as, for example: instantaneously sensing by the asynchronous ADC; capture by the set of delay cells; and processing by bandwidth of conventional digital systems. The effect of such a limit may also be to minimize the quantization error [33]. The error may be minimized due to the fact that at the comparators transition points the value of the input signal may be exactly known and equal to the pre-defined thresholds.

Additional benefits of continuous time digital signal processing may include power savings [33]. In one embodiment of the present invention the processor may be active only when the input signal changes and, unlike clocked systems, it may not burn power in a steady state. This can allow for the design of digital controllers that require very low-power, which is important in SMPS for low-power systems, where the controller power consumption can have a significant effect on the overall power supply efficiency [27].

In one embodiment of the invention, the CT-DSP can implement a capacitor charge balance algorithm. It may detect the time of the maximum output voltage deviation as well as the magnitude of that peak/valley point. Based on those two values only, the asynchronous digital logic can determine the transistor on/off times ($t_{on}/t_{off}$) that result in the fastest possible voltage recovery, i.e. optimal recovery time. The results of the calculation may be sent to the optimal sequence generator creating the optimal on/off transistor switching sequence u(t). When the mode control logic detects the voltage in a close proximity of its reference $V_{ref}$, the CT-DSP can pass the control task to the PID compensator.

Optimal Recovery Time Algorithm

Figure 2:
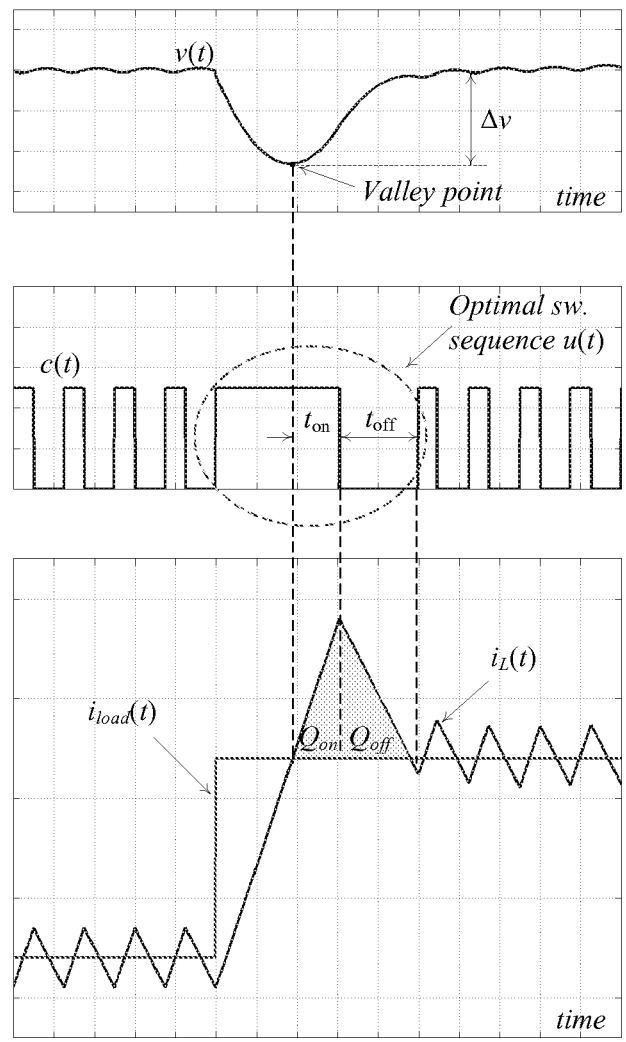
FIG. 2 illustrates an optimal recovery after a disturbance causing the output voltage drop.

In one embodiment of the present invention, as shown in FIG. 2, an optimal recovery time algorithm, implementing charge balance principle [5], [7]-[9], [11], [13], may be applied. FIG. 2 depicts a buck converter's output capacitor voltage and inductor current recovery after a light-to-heavy load transient (or some other disturbance causing a loss of the output capacitor charge). The response can be divided into two phases. In the first phase, immediately following the transient, the CT-DSP can turn on the main switch $Q_1$, as shown in FIG. 1, increasing the inductor current $i_L(t)$. The first phase can be set to end when the maximum voltage deviation, such as, for example, the valley point, is detected. At this time instant the load and inductor currents are equal. In the following phase the CT-DSP can calculate $t_{on}$ and $t_{off}$ transistor times.

FIG. 2 shows optimal recovery after a disturbance causing the output voltage drop and indicates the output capacitor voltage, v(t), the gate-drive control signal c(t), and inductor and load currents $i_L(t)$ and $i_{load}(t)$. In the following phase the CT-DSP can calculate $t_{on}$ and $t_{off}$ transistor times and produce a switching sequence such that:

At first, the inductor current further increases exceeding the load value, to make up for the loss of the output capacitor C charge $$Q = C\Delta v \qquad (2)$$

where $\Delta v$ is the maximum output voltage deviation during the transient.

Right after the optimal switching sequence is completed, the inductor current returns to its new steady state value $I_L = I_{load}$.

In other words, the optimal-time response may be obtained by sizing the shaded triangle shown in FIG. 2, such that its area $Q_{on} + Q_{off}$ (the capacitor charge introduced by the inductor current) is equal to Q.

To simplify the calculation of $t_{on}$ and $t_{off}$ times, and consequently CT-DSP implementation, it is assumed that voltage deviation during transient is relatively small compared to its regulated dc value, which may be a value such as, for example, less than 10%, (i.e. $v \approx V_{ref} = V_{out}$), which for most properly designed power supplies is accurate.

Under such an approximation, the amounts of charge comprising the shaded triangle can be expressed as:

$$Q_{on} = \int_0^{t_{on}} \int_0^t \frac{V_g - V_{out}}{L} dt\, d\tau \qquad (3)$$

$$Q_{off} = \int_0^{t_{off}} \int_0^t \frac{V_{out}}{L} dt\, d\tau \qquad (4)$$

where $V_g$ is the input voltage of the converter.

Furthermore, by observing the waveform of FIG. 2 the relation between $t_{on}$ and $t_{off}$ can be obtained geometrically:

$$\frac{t_{on}}{t_{off}} = \frac{Q_{on}}{Q_{off}} = \frac{V_{out}}{V_g - V_{out}}. \qquad (5)$$

By combining (2), (3), and (4) and the capacitor charge balance equation:

$$Q_{on} + Q_{off} = Q = C\Delta v, \qquad (6)$$

the following expressions may be derived for the optimal transistor on and off times:

$$t_{on} = \sqrt{\frac{2LC\Delta v V_{out}}{V_g(V_g - V_{out})}} = k_1 \frac{D}{\sqrt{1-D}} \sqrt{\Delta v}, \qquad (7)$$

$$t_{off} = \sqrt{\frac{2LC\Delta v(V_g - V_{out})}{V_g V_{out}}} = k_1 \sqrt{1-D}\sqrt{\Delta v}, \qquad (8)$$

where D is the steady state value of duty ratio, and $k_1 = \sqrt{2LC/V_{out}}$.

It can be shown that the same results for optimal $t_{on}$ and $t_{off}$ times may be obtained for a heavy-to-light load transition, but with the switching sequence reversed. Analysis for other converter topologies may yield optimal times expressions of similar complexity.

Practical Implementation

Seemingly, the practical implementation of (7) and (8) requires a fairly powerful processor as well as fast and accurate analog hardware. However, in one embodiment of the present invention, by utilizing digital correction of measurement errors and easily accessible information of the PID loop, this application specific CT-DSP can be realized with simple elements.

A. Application Specific CT-DSP

Figure 3:
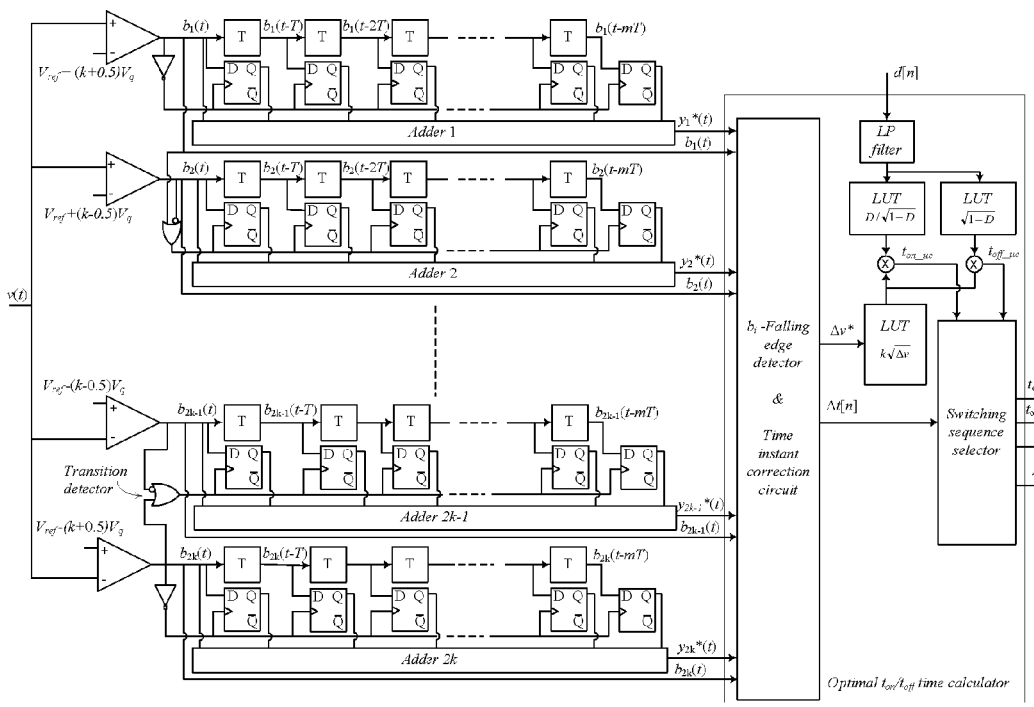
FIG. 3 illustrates the architecture of the application-specific continuous-time digital signal processor.
Figure 4:
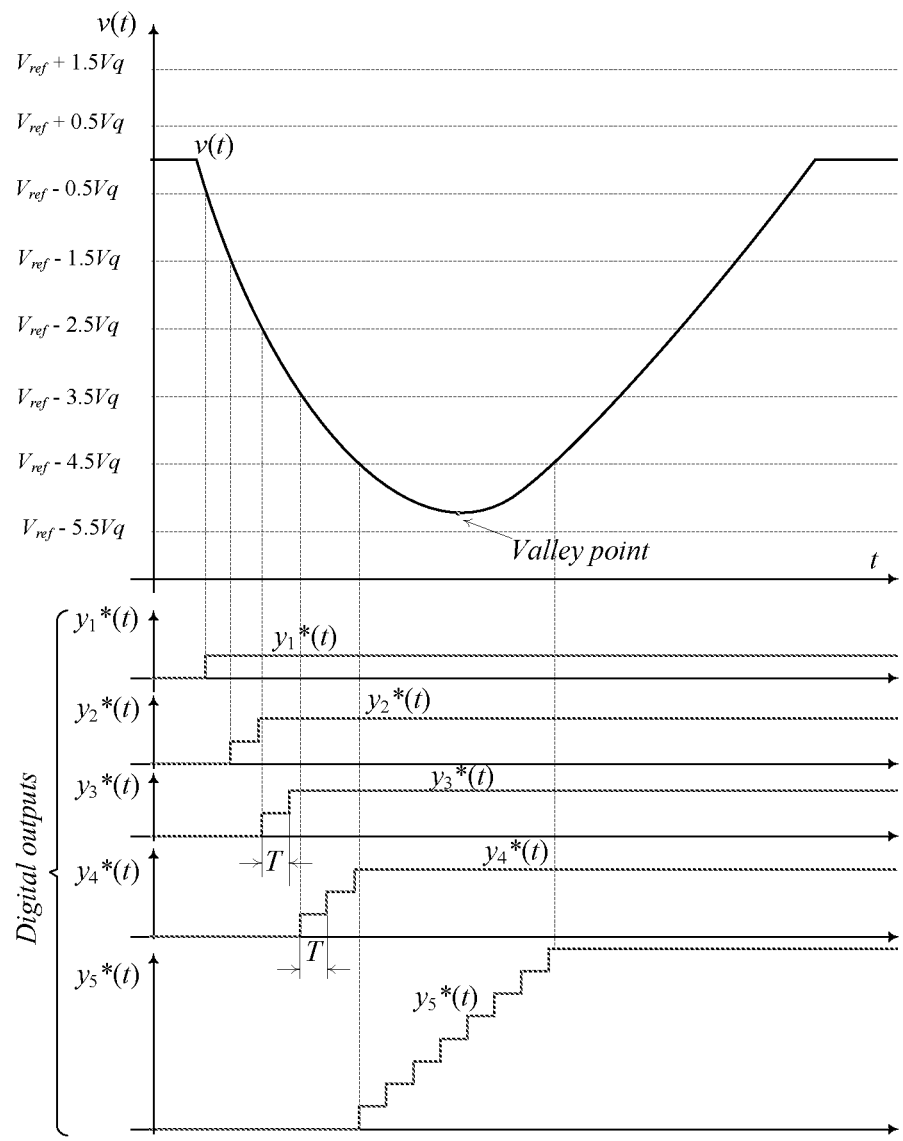
FIG. 4 illustrates the main signals of the application-specific continuous-time digital signal processor during a voltage dip.

Embodiments of the present invention's architecture of the application-specific continuous-time digital signal processor for obtaining the optimal switching sequence and its waveforms during the recovery from a voltage drop are shown in FIGS. 3 and 4.

In one embodiment of the present invention, the CT-DSP may have two main blocks. The first comprising comparators, delay cells, and adders, captures the time instant and magnitude of the maximum deviation (i.e. valley point). The second block is the optimal $t_{on}/t_{off}$ calculator. As shown in FIG. 1, this embodiment may create control signals for the optimal switching sequence. After a comparator i, $0 \leq i \leq 2k$, is triggered by a change of the output voltage, the corresponding continuous-time digital signal $y_i^*(t)$ may be generated, as shown in FIG. 4. This is shown as the main signals of the application-specific continuous-time digital signal processor during a voltage dip, including output voltage, and five continuous-time digital outputs. Like the signals of conventional continuous-time systems, in embodiments of the present invention the signals can start at any point in time without a sampling delay, which typically exists in clocked digital systems. In an embodiment of the present invention the digital value of $y_i^*(t)$ may be calculated by an asynchronous adder. It is a stair function with the time step T and magnitude proportional to the number of delay cells signal $b_i(t)$ has propagated through.

In an embodiment of the present invention, the rise of $y_i^*(t)$ may end when the comparator i resets to zero or a neighboring comparator is triggered. As shown in FIG. 3, the change of comparators states may be sensed by a simple detector and, at that point, the state of $y_i^*(t)$ can be captured with D-latches. In this way the conversion of a short time interval between two changes of comparators' states into a digital value may be performed, with the time resolution equal to the propagation time of a delay cell. The value produced by the comparator that is last to set and first to reset may be used to determine the time instant of the valley point shown in FIG. 2. This is the time reference for $t_{on}$ and $t_{off}$ time intervals. In one embodiment of the present invention, having the voltage deviation shown in FIG. 4, the continuous-time digital signal $y_5^*(t)$ may be used for the instant determination.

As shown in FIG. 3, in one embodiment of the present invention, detection of the magnitude of the maximum voltage deviation may be performed by the block named $b_i$-falling edge detector and time instant correction circuit. It can detect the output of the comparator that first changes its state from high to low and may use the results of time-to-digital output conversion, to precisely determine parameters of the extreme deviation point.

In another embodiment of the present invention, to eliminate the need for an extra ADC, out of the two forms of (7) and (8), the equations may be implemented for calculating $t_{on}$ and $t_{off}$ that do not require information about the input voltage $V_g$. Obtained amplitude of the voltage deviation may be fed to a look-up table (LUT) that produces $k_1 \sqrt{\Delta v[n]}$. Then, the output of the LUT can be multiplied by $D/\sqrt{1-D}$ and $\sqrt{1-D}$, respectively. Immediately after the computations of the optimal times are completed the results may be sent to the optimal sequence generator, as shown in FIG. 1, together with a peak detection signal st(t), used for triggering the generator.

As shown in FIG. 3, in one embodiment of the present invention, the steady-state duty ratio value D may be obtained by low-pass filtering of the PID compensator output. Due to recent advances in mass-memory design [37] in another embodiment of the present invention the above mentioned square-root functions may also be implemented with look-up tables occupying a small silicon area.

A.1. Digital Correction of Measurement Errors

One method of accurately capturing the point of the maximum voltage deviation utilizes a large number of very precise high-speed comparators and delay cells. However, such a solution can increase the controller complexity so that its implementation is impractical, both in terms of the overall system cost and its power consumption. In one embodiment of the present invention, a windowed flash ADC may be applied, with large quantization steps $V_q$, sized to barely satisfy the output voltage regulation requirements [27]. This selection significantly simplifies the hardware by minimizing the number of comparators required, but at the same time compromises the accuracy in finding both the magnitude and time instant of the peak/valley point.

Figure 5:
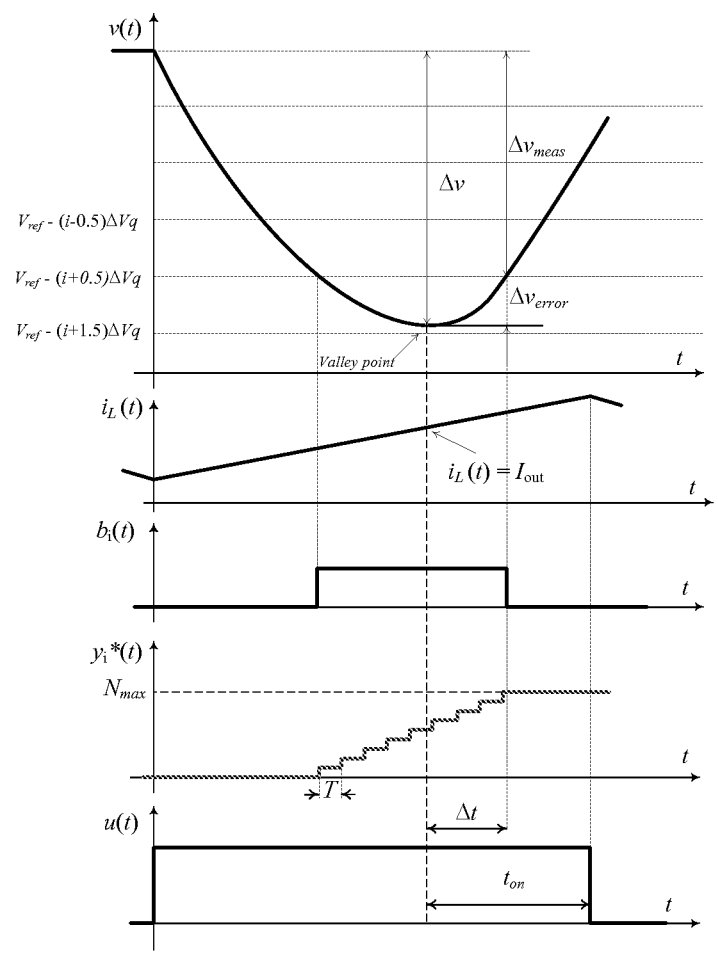
FIG. 5 illustrates signals of the CT-DSP during a voltage dip.

As shown in FIG. 5, the coarse ADC resolution has a particular effect in one embodiment of the present invention. Signals of the CT-DSP during a voltage dip are shown in FIG. 5 including, output voltage v(t), inductor current $i_L(t)$, the output of the last triggered comparator $b_i(t)$, corresponding continuous-time digital signal $y_i^*(t)$, and the optimal switching sequence u(t). As shown, the valley occurs in between two quantization thresholds, thus, the calculation of the deviation parameters is delayed by $\Delta t$. It is possible only after $y_i^*(t)$ reaches its final value $N_{max}$. Also, an error in amplitude measurement $\Delta v_{error}$ can be observed.

To compensate for these, digital error correction may be applied in one embodiment of the present invention. First, as shown in FIG. 3, the delay may be approximated as $\Delta t = N_{max} T/2$ and used for the correction of the calculated $t_{on}$ value. The estimated delay time may also be used for effective resolution improvement, where the quantization error for the buck converter of FIG. 1 is calculated as:

$$\Delta v_{error} = \frac{1}{C} \int_0^{t_0+\Delta t} \Delta i_L \cdot d\tau \qquad (9)$$
$$= \frac{1}{C} \int_0^{t_0+\Delta t} \frac{V_g - V_{out}}{L} \cdot \tau \cdot d\tau$$
$$= \frac{1}{2} \frac{V_g - V_{out}}{LC} \Delta t^2$$
$$= k_2 \frac{1-D}{D} \Delta t^2$$

and added to the initially measured voltage deviation $\Delta v_{meas}$, where $k_2 = V_{out}/(2LC)$.

In yet another embodiment of the present invention, fast processing of the signals during transients may be obtained with an oversampling ADC and a powerful processor. However, to achieve the same time resolution as that of a delay cell a very high frequency ADC may be required. For example, for a time step of 1 ns, easily achievable with a 5-transistor delay cell [38], an ADC with 1 GHz sampling rate would be required. This embodiment may consequently be more complex and costly than other embodiments that apply a complete low-power SMPS.

B. Optimal Sequence Generator

Figure 6:
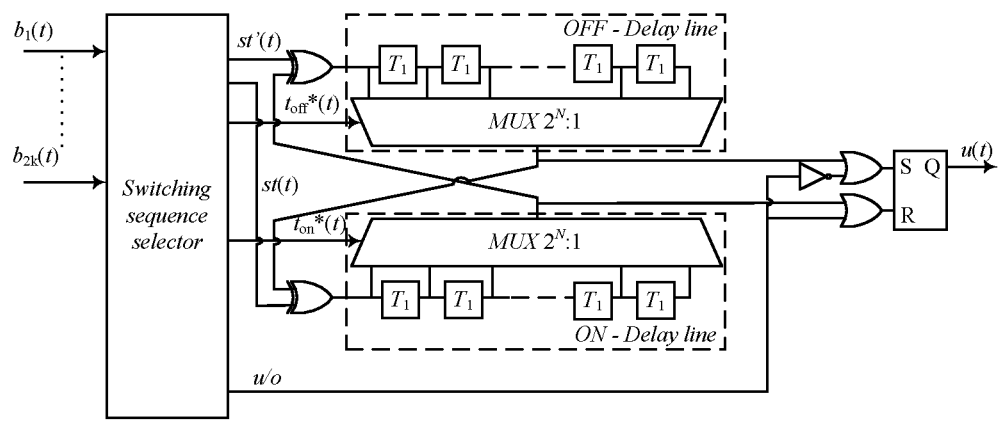
FIG. 6 illustrates an optimal sequence generator.

As shown in FIG. 6, in one embodiment of the present invention, an optimal sequence generator may be applied. It comprises two delay lines for generating $t_{on}$ and $t_{off}$ time intervals, an S-R latch, and 2-XOR gates. An output voltage deviation may activate the generator. At that time, the switching selector can recognize the type of the transient and the SR-latch controlling the transistor $Q_1$ of FIG. 1 may be set or reset, through the u/o signal. After the maximum voltage deviation is sensed and optimal times calculated either the triggering pulse st(t) for the ON-delay line or st'(t) for the OFF-delay line may be created, depending on the type of transient. As a result u(t) may go from high to low after $t_{on}$ in the case of a voltage dip or in the other direction after an overshoot. As soon as the initially excited delay line changes its output it can trigger the opposite line as well as the SR latch changing the value of u(t). After the signal propagates through the second delay line the optimal switching sequence may be completed and the PID compensator of FIG. 1 can resume voltage regulation.

C. Influence of the Output Capacitor and LC Parameter Variations

C.1. Equivalent Series Resistance

Figure 7:
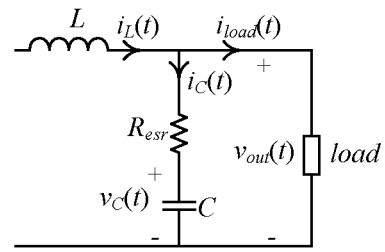
FIG. 7 illustrates a model of the output filter of a buck converter that includes capacitor equivalent series resistance (ESR)

One embodiment of the present invention, may be designed for low-power SMPS, where predominantly ceramic capacitors with very small equivalent series resistance (ESR) are used. In another embodiment of the present invention, using capacitors with a non-negligible ESR the effect of the particular capacitors has to be taken into account. To achieve the required design an aspect of the invention is that the capacitor may be modeled, as shown in FIG. 7. The output voltage $v_{out}(t)$ may be written as:

$$v_{out}(t) = v_c(t) + R_{esr} i_c(t) = v_c(t) - R_{esr}(i_L(t) - i_{load}(t)), \quad (10)$$

where $R_{esr}$ is the ESR value and $v_c(t)$ voltage across the ideal capacitor. Ideally, ESR should not affect the optimal switching sequence. At the point where the inductor and load currents are the same, i.e. $i_c(t)=0$, the ESR may not have any influence on the output voltage deviation and the equations for the optimal sequence can remain the same as in the ideal case. The sequence may start when the zero capacitor current is detected and have the $t_{on}$ and $t_{off}$ times defined by (8) and (9). However, as described below, ESR can cause the peak/valley point to happen at $i_c(t) \neq 0$ and erroneous detection of the key time instant. As a consequence the $t_{on}$ and $t_{off}$ times can be miscalculated and a sub-optimal switching sequence created.

In another embodiment of the present invention, to quantify this influence the buck converter of FIG. 1 may be observed as an example. Again, a light-to-heavy load transient may be analyzed, where at $t=0$ a step of $\Delta I_{load}$ occurs and the CT-DSP immediately turns on the main switch $Q_1$ responding to the transient. For this case (10) can be rearranged as:

$$v_{out}(t) = \quad (11)$$
$$V_{out} + R_{esr}\left(\frac{V_g - V_{out}}{L}t - \Delta I_{load}\right) + \frac{1}{C}\int_0^t \left(\frac{V_g - V_{out}}{L}t - \Delta I_{load}\right)dt.$$

Now the valley happens at the point where the time-derivative of (11) is zero. By finding the derivative and replacing the result in (11) both the time instant of the valley point $t_{esr}$ and its magnitude $\Delta v_{esr}$ can be obtained:

$$t_{esr} = \frac{LC}{V_g - V_{out}}\Delta I_{load} - CR_{esr} \quad (12)$$

$$\Delta v_{esr} = \left(\frac{\Delta I_{load} t_{esr}}{C} - \frac{V_g - V_{out}}{LC}\frac{t_{esr}^2}{2}\right) + R_{esr}\left(\Delta I_{load} - \frac{V_g - V_{out}}{L}t_{esr}\right). \quad (13)$$

It can be seen that the ESR may cause the valley to happen before $i_c(t)=0$ (while $i_{load}(t)$ is still larger than $i_L(t)$) and, consequently, a pre-mature triggering. This effect also can increase the magnitude of the valley, cause an undershoot, and is slower then the ideal response.

From (12) we can see that compared to ideal case the valley leads by $\tau_{esr}=CR_{esr}$. In one embodiment of the present invention, if $\tau_{esr}$ is known with a certain accuracy it can be taken into account and the CT-DSP algorithm modified accordingly. More precisely, the sampling of the peak deviation and the triggering of the switching sequence can be delayed by $\tau_{esr}$ to compensate for the ESR influence. In yet another embodiment of the present invention, the compensation of the ESR can be performed through a three-step auto-tuning procedure. Initially, the optimal sequence can be created assuming zero ESR, then based on the voltage overshoot/undershoot after the optimal sequence is completed $\tau_{esr}$ can be calculated and optimal sequence modified.

C.2. LC Parameter Variations

From (7) and (8) it can be seen that the parameter $k_1$, depends on the L and C values affecting the calculation of $t_{on}$ and $t_{off}$ times. Hence, the tolerance of the components and their changes due to external influences can result in a non-optimal switching sequence. However, since $k_1$ depends on the square root of the LC product, this effect is often small over a relatively large range of the product variations, causing a slight undershoot or overshoot that can be compensated by the PID regulator.

In one embodiment of the present invention, in the case of a large variation, auto-compensation methods can be applied [29], [40]. For example, the gain $k_1$ can be adjusted in two steps, as demonstrated in a predictive current mode controller [40] suffering from a similar problem. First, the initial value of $k_1$ can be set, then, in the next step, it can be adjusted depending on the size of undershoot/overshoot. In another embodiment of the present invention, a similar two-step gain correction technique for the compensation of the LC variations may also be applied in a modification of the previously mentioned all-digital optimal controller [15]. In yet another embodiment, the LC product can be estimated from the frequency of limit-cycle oscillations, as described in [29].

Based on the diagrams shown in FIGS. 1, 3 and 6, an embodiment of the present invention may include a controller system built around a buck converter, for example, such as a buck converter of 5 V to 1.8 V, 5 W, operating at switching frequency, such as that of $f_{sw}=400$ kHz.

EXAMPLE

As an example, a continuous-time digital controller was implemented with an FPGA based system as well as with commercially available comparators and programmable delay lines. To design an asynchronous flash ADC, only 8 comparators were used and a constant quantization step of $V_q=25$ mV was set. The delay lines were comprised of 64 cells, each having 40 ns propagation time, to provide sufficiently long total delay to capture a time intervals between two successive triggerings of CT-DSP's comparators which is usually shorter than the switching period.

It should be noted that in on-chip implementation, where it is desired to minimize silicon area, the number of cells can be significantly reduced by sharing only one delay line among all comparators and using current-starved delay elements. The propagation time of the current starved cells can be shorter than 1 ns, allowing the use of the continuous-time digital controller in SMPS operating at switching frequencies of several MHz and higher.

Functional Verification

Figure 8:
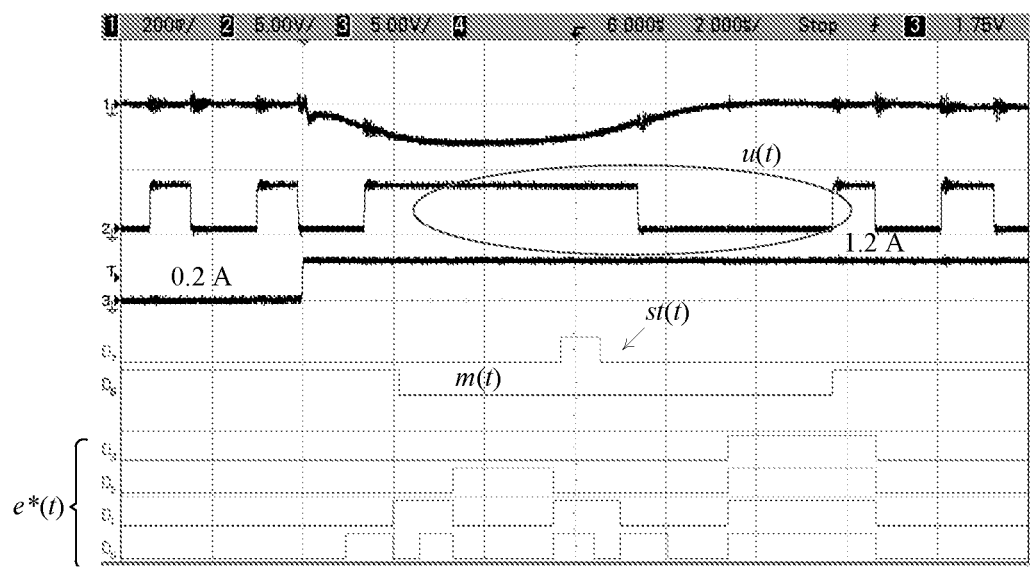
FIG. 8 illustrates signals of the CT-DSP during a 0.2 A to 1.2 A load transient.
Figure 9:
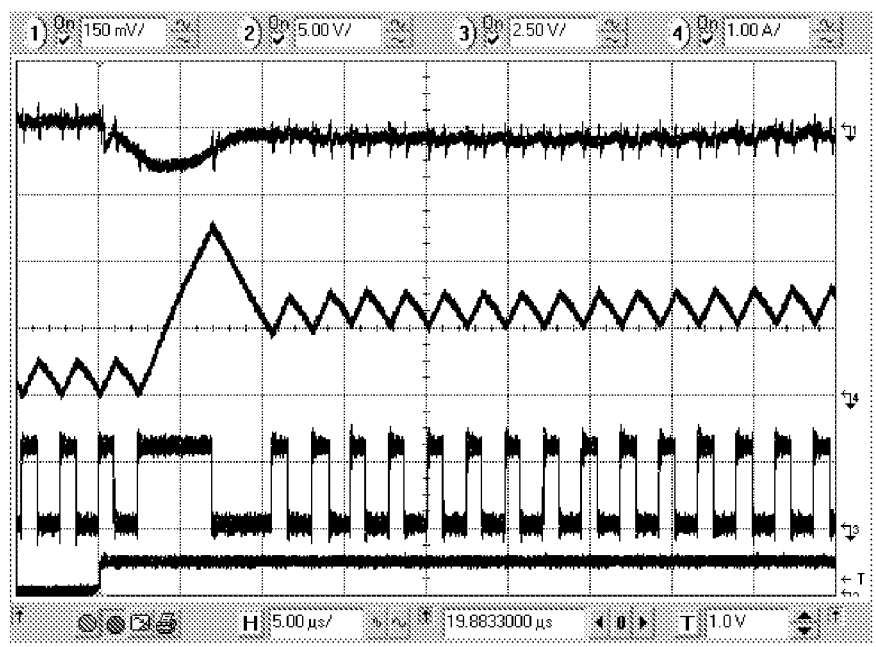
FIG. 9 illustrates voltage and current waveforms of the experimental system during a 0.2 A to 1.2 A load transient.

To verify the operation of the developed continuous-time digital signal processor, its key signals were observed during a 0.2 A to 1.5 A load transient. The results are shown in FIGS. 8 and 9. As it can be seen from FIG. 8, right after the transient, the mode signal m(t) (also shown in FIG. 1) enables the CT-DSP and the transistor $Q_1$ stays in on state (had it been open it would have turned on immediately). When the peak point is detected, the detection signal st(t) is activated, with a delay $\Delta t$. The remaining part of the optimal u(t) is generated by the programmable delay line and the voltage recovers in a single on-off switching cycle. Once the steady state is reached, the mode control signal disables the CT-DSP and the PID compensator of FIG. 1 used for the regulation and compensation of small voltage variations is active again. Waveforms of the binary weighted error signal that is fed into the PID compensator are also shown.

Signals of the CT-DSP during a 0.2 A to 1.2 A load transient are shown in FIG. 8, wherein—Ch.1: Output voltage v(t), 200 mV/div; Ch 2: gate-drive signal; Ch.3: control signal for load transient circuit; D0-D3: binary-weighted continuous-time digital error e*(t) of the PID compensator; D6: mode control signal; D7: peak detection signal st(t); and the time scale is 2 µs/div.

The waveforms also verify proper operation of the digital error correction block. It can be seen that due to the coarse quantization steps of the flash ADC the peak detection signal st(t) is delayed. Still, the previously described algorithm takes the delay into account and corrects transistor on time to achieve virtually optimal response.

It should be noted that compared to the embodiment, shown in FIG. 2, a slight delay in the reaction to load transient, indicated by signal m(t), may exist. This is because of the digital logic for load transient recognition that only reacts on the output voltage variations larger than 2 quantization steps and finite propagation time of the FPGA's digital circuits. Since the $t_{on}$ and $t_{off}$ times are calculated with respect to the peak/valley point, this delay does not necessarily affect CT-DSP algorithm but can influence the overall response time. If the CT-DSP is fully implemented on a chip, this effect can be significantly minimized by using faster application-specific digital logic and/or a simple high-pass filter for transient detection.

FIG. 9 shows experimental voltage and current waveforms similar to the idealized signals of FIG. 2. Voltage and current waveforms of the experimental system during a 0.2 A to 1.2 A load transient, wherein—Ch.1: Output voltage v(t), 150 mV/div—ac; Ch.2: the control signal of a load change circuit; Ch.3: Gate drive signal; Ch.4: Inductor current $i_L(t)$, 1 A/div—dc; and the time scale is 5 µs/div. Over the duration of the optimal switching sequence the inductor current may exceed the load value to make up for the lost capacitor charge and returns to the new steady state right at the end of the sequence.

Also, it can be seen that the PID compensator can eliminate the steady state error, which the CT-DSP itself is not able to accomplish, due to components variations and other imperfections that are not take into account in the optimal sequence calculations.

Performance Comparison.

To verify the advantages of the continuous-time digital controller over commonly used voltage mode digital PWM regulators, load transient response with and without the CT-DSP based recovery mechanism was compared. The conventional controller has a PID compensator designed such that the crossover frequency of the system is $f_c \approx f_{sw}/15$, which is a common choice in the conventional digital PID design [27] where the sampling imposes bandwidth limitations. The results for heavy-to-light and light-to-heavy load transients are shown in FIGS. 10 to 13.

Figure 10:
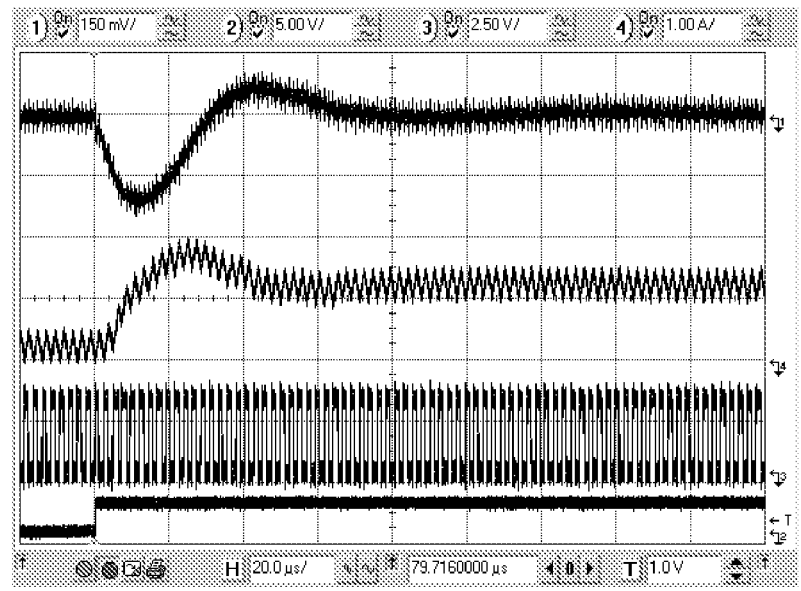
FIG. 10 illustrates the PID controller's response to a 0.2 A to 1.2 A load step change.

FIG. 10 shows PID controller's response to a 0.2 A to 1.2 A load step change, wherein—Ch.1: output voltage v(t), 150 mV/div—ac; Ch.3: gate drive signal, 2.5V/div; Ch.4: load change command; Ch.4: inductor current $i_L(t)$, 1 A/div; and time scale is 20 µs/div.

Figure 11:
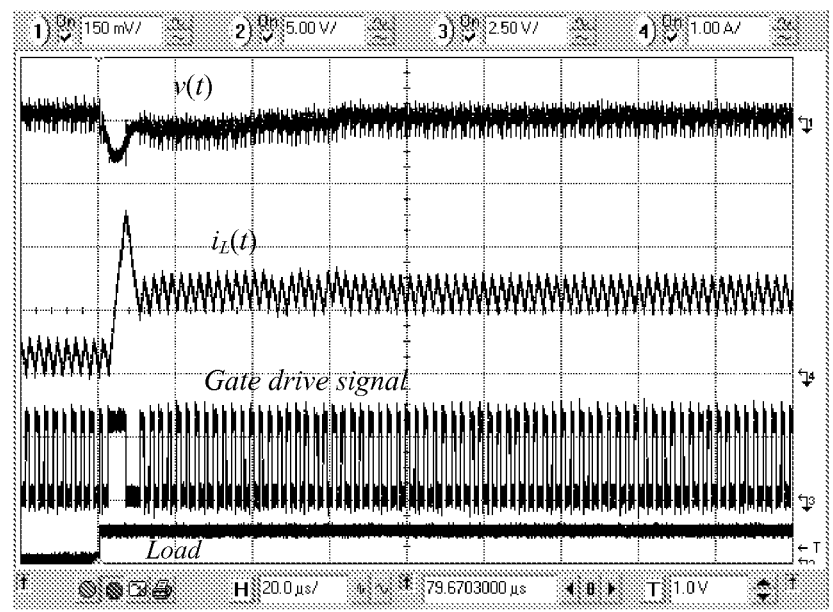
FIG. 11 illustrates the CT-DSP controller's response to a 0.2 A to 1.2 A load step change.

FIG. 11 shows CT-DSP controller's response to a 0.2 A to 1.2 A load step change, wherein—Ch.1: output voltage v(t), 150 mV/div—ac; Ch.3: gate drive signal, 2.5V/div; Ch.4: load change command; Ch.4: inductor current $i_L(t)$, 1 A/div; and time scale is 20 µs/div.

Figure 12:
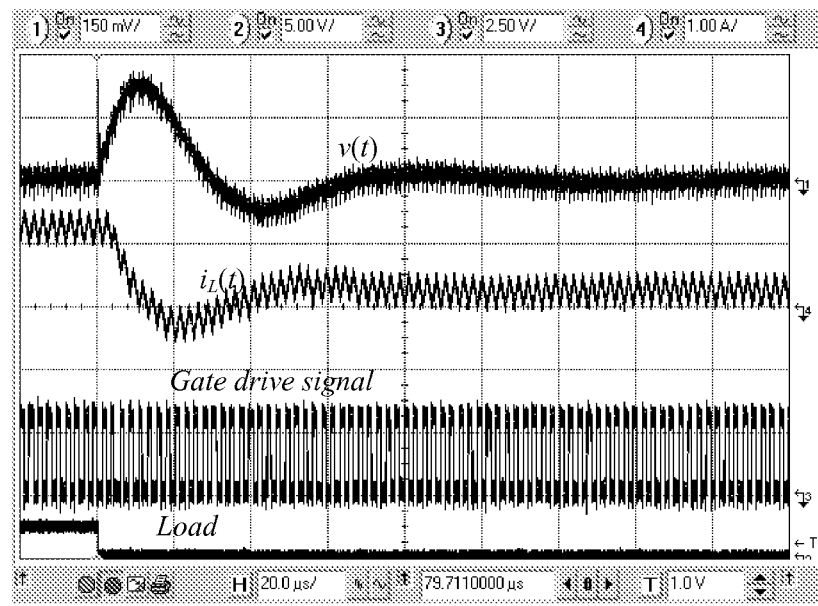
FIG. 12 illustrates the PID controller's response to a 1.2 A to 0.2 A load step change.

FIG. 12 shows PID controller's response to a 1.2 A to 0.2 A load step change, wherein—Ch.1: output voltage v(t), 150 mV/div—ac; Ch.3: gate drive signal, 2.5V/div; Ch.4: load change command; Ch.4: inductor current $i_L(t)$, 1 A/div; and time scale is 20 µs/div.

Figure 13:
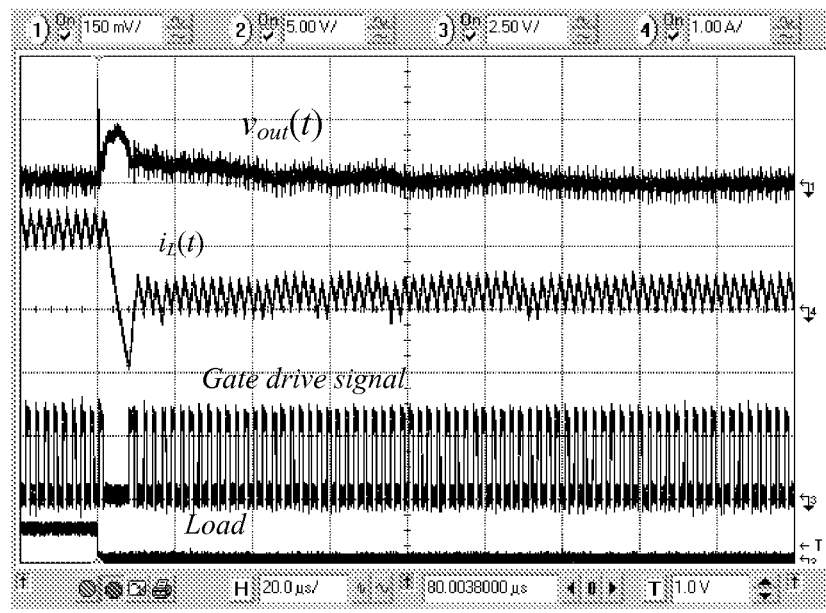
FIG. 13 illustrates the CT-DSP controller's response to a 0.2 A to 1.2 A load step change.

FIG. 13 shows CT-DSP controller's response to a 0.2 A to 1.2 A load step change, wherein—Ch.1: output voltage v(t), 150 mV/div—ac; Ch.3: gate drive signal, 2.5V/div; Ch.4: load change command; Ch.4: inductor current $i_L(t)$, 1 A/div; and time scale is 20 µs/div.

Together FIGS. 10-13 verify that the CT-DSP can result in improved load transient response. In this case, the recovery time is about three to four times shorter and the overshoots/undershoots are about three times smaller, allowing for the proportional reduction of the output capacitor [2]. The response of the CT-DSP is practically limited with the power stage inductor and capacitor values.

System Behavior Under Parameter Variations

To show the influence of LC variations and that of the ESR two modifications on the power stage of the original system were performed while the CT-DSP algorithm was left unchanged. First, the value of the output ceramic capacitor was changed by 20%. Then, the widely available ceramic capacitor with $R_{esr}$ smaller than 5 mΩ was replaced with a tantalum, having approximately seven times larger ESR.

Figure 14:
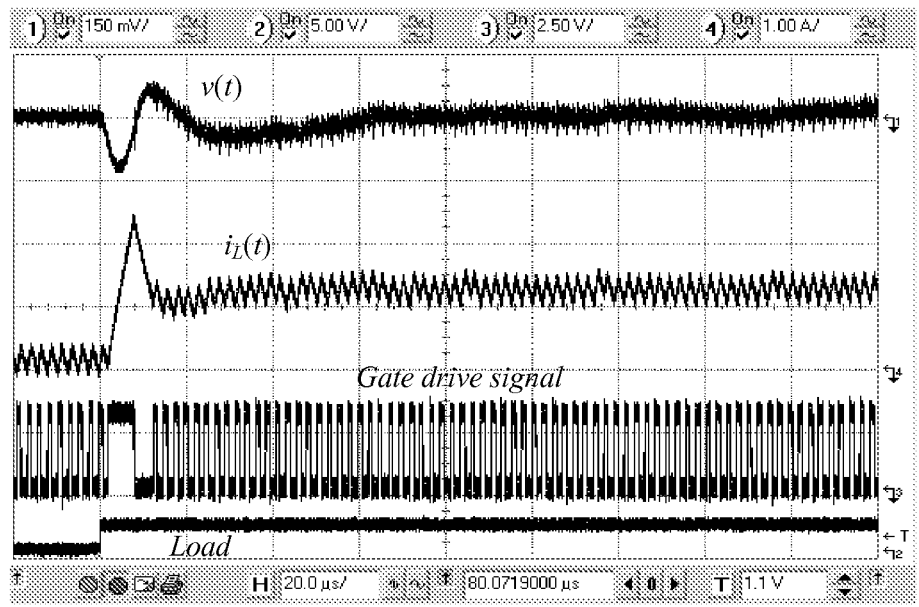
FIG. 14 illustrates the CT-DSP controller's response to a 0.2 A to 1.2 A load step change for the case when the output capacitance is 20% smaller than the rated value.

FIG. 14 shows a load transient response for the case when the output capacitance is 80% of the rated value. Specifically CT-DSP controller's response to a 0.2 A to 1.2 A load step change for the case when the output capacitance is 20% smaller than the rated value is shown, wherein—Ch.1: output voltage v(t), 150 mV/div—ac; Ch.3: gate drive signal, 2.5V/div; Ch.4: load change command; Ch.4: inductor current $i_L(t)$, 1 A/div; and time scale is 20 µs/div. It can be seen that in this embodiment $t_{on}$ and $t_{off}$ times, given by (7) and (8) are miscalculated so they are larger than optimal, causing a 70 mV overshoot after the switching sequence is completed. This overshoot is followed by a smaller much smaller dip. Even in this case the load transient causes about 2.5 times smaller deviation than when the PID regulator is used and about 1.5 times shorter settling time. As mentioned earlier, by applying a two-step gain correction algorithm [15], [40] or the auto-tuning methods presented in [27], [29] this response can be improved.

Figure 15:
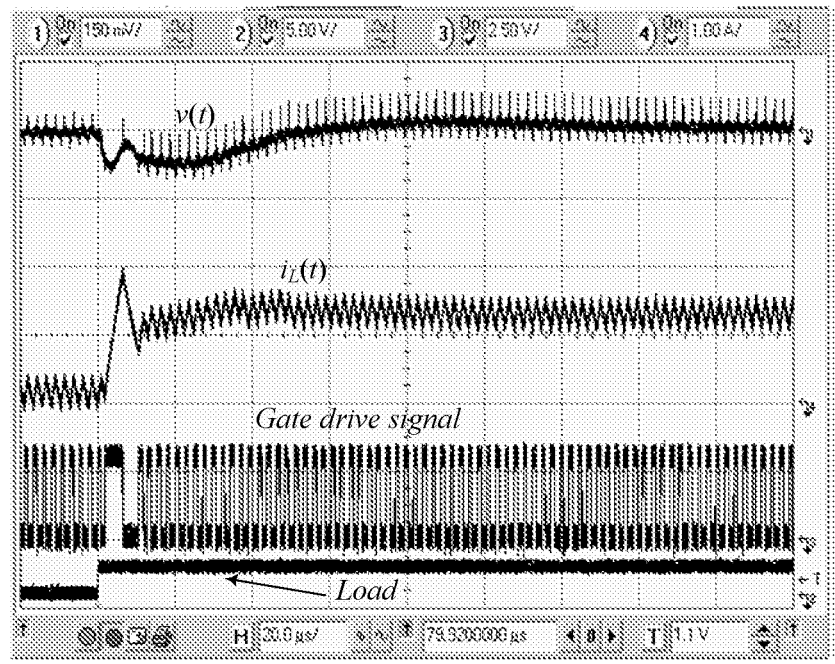
FIG. 15 illustrates the CT-DSP controller's response to a 0.2 A to 1.2 A load step change.

A load transient response with a tantalum capacitor having large ESR ($R_{esr} \approx 35$ mΩ) is shown in FIG. 15. CT-DSP controller's response to a 0.2 A to 1.2 A load step change, wherein—Ch.1: output voltage v(t), 150 mV/div—ac; Ch.3: gate drive signal, 2.5V/div; Ch.4: load change command; Ch.4: inductor current $i_L(t)$, 1 A/div; and time scale is 20 µs/div. The ESR can cause earlier triggering, a shorter capacitor charging time than optimal, and incomplete recovery of the lost capacitor charge after the sequence produced by the CT-DSP is completed. However, since at the end of the sequence a new steady-state is almost reached and voltage deviation is relatively small, the PID compensator compensates for the mismatch. By comparing the response with that of the conventional PID, shown in FIG. 10, we can see that even in the presence of a large ESR the proposed method significantly improves load transient response.

It will be appreciated by those skilled in the art that variations of the embodiments described herein may also be practiced without departing from the scope of the invention. Other modifications are therefore possible. For example, the delay lines of the CT-DSP can be replaced with another type of voltage-to-time converter, such as the combination of a counter and ring oscillator that can be shared among all comparators. Moreover, the look-up tables used for providing optimal on and off time values can be replaced with a small dedicated processing unit that would require a significant smaller silicon area. A skilled reader will recognize that further variations are also possible.

List Of References

[1] R. W. Erickson and D. Maksimović, *Fundamentals of Power Electronics*—Second Edition, Kluwer, 2000.
[2] E. Lam, R. Bell, and D. Ashley, "Revolutionary advances in distributed power systems," in *Proc. IEEE APEC Conf.*, 2003, pp. 30-36.
[3] R. Redl, B. P. Erisman, and Z. Zansky, "Optimizing the load transient response of the buck converter," in *Proc. IEEE APEC Conf.* 1998, Volume 1, 15-19 Feb. 1998, pp. 170-176.
[4] R. Miftakhutdinov, "Analysis and optimization of synchronous buck converter at high slew-rate load current transients" in *Proc. IEEE PESC Conf.* 2000, Vol. 2, 18-23 Jun. 2000 pp. 714-720.
[5] K. S. Leung and H. S. Chung, "Dynamic hysteresis band control of the buck converter with fast transient response," *IEEE Trans. Circ. Syst.*—II: Express briefs, vol. 52, July 2005.
[6] R. Redl and N. O. Sokal, "Current-mode control, five different types, used with the three basic classes of power converters: small-signal ac and large-signal dc characterization, stability requirements, and implementation of practical circuits," in *Proc. IEEE PESC Conf.*, 1985, pp. 771-785.
[7] K. S. Leung and H. S. Chung, "Derivation of a second-order switching surface in the boundary control of buck converters," *IEEE Power Electron. Lett.*, vol. 2, no. 2, June 2004, pp. 63-67.
[8] K. S. Leung and H. S. Chung "A comparative study of the boundary control of buck converters using first- and second-order switching surfaces—Part I: Continuous conduction mode," in *Proc. IEEE PESC Conf.*, 2005, pp. 2133-2139.
[9] K. S. Leung and H. S. Chung "A comparative study of the boundary control of buck converters using first- and second-order switching surfaces—Part II: Discontinuous conduction mode," in *Proc. IEEE PESC Conf.*, 2005, pp. 2126-2132.
[10] M. Ordonez, M. T. Iqbal, and J. E. Quaicoe, "Selection of a curved switching surface for buck converters," *IEEE Trans. Power Electron.*, vol. 21, pp. 1148-1153, July 2006.
[11] A. Soto, P. Alou, J. A. Oliver, J. A. Cobos and J. Uceda, "Optimum control design of PWM-buck topologies to minimize output impedance", in *Proc. IEEE APEC Conf.*, 2002. Vol. 1, 10-14 Mar. 2002, pp. 426-432.
[12] A. Soto, A, P. Alou, J. A. Cobos, "Nonlinear digital control breaks bandwidth limitations," in *Proc. IEEE APEC Conf.* 2006, pp. 42-47.
[13] G. Feng, W. Eberle and Y. Liu, "A new digital control algorithm to achieve optimal dynamic performance in DC-DC converters", in *Proc. IEEE PESC Conf.*, 2005, pp. 2744-2748.
[14] "High performance digital control algorithms for DC-DC converters based on the principle of capacitor charge balance" in *Proc. IEEE PESC Conf.*, 2006, 18-22 Jun. 2006, pp. 1740-1743.
[15] G. Feng, E. Meyer, and Y. F. Liu, "Novel digital controller improves dynamic response and simplifies design process of voltage regulator module," in *Proc. IEEE APEC Conf.* 2007, pp. 1447-1453.
[16] G. Feng, E. Meyer, and Y. F. Liu, "A New digital control algorithm to achieve optimal dynamic performance in DC-to-DC converters," *IEEE Trans. Power Electron.*, Volume 22, Issue 4, July 2007, pp. 1489-1498.
[17] S. Buso, S. Fasolo, L. Malesani and P. Mattavelli, "A dead-beat adaptive hysteresis current control", *IEEE Trans. Indu. Appl*, Vol. 36, Issue 4, July-August 2000, pp. 1174-1180.
[18] J. Chen, A. Prodić, R. W. Erickson, and D. Maksimović, "Predictive digital current programmed control", *IEEE Trans. Power Electron.*, Vol. 18, Issue 1, Part 2, January 2003. pp. 411-419.
[19] S. Bibian and Hua Jin, "High performance predictive dead-beat digital controller for DC power supplies", *IEEE Trans. Power Electron.*, Vol. 17, Issue 3, May 2002, pp. 420-427.
[20] A. Kelly and K. Rinne, "Sensorless current-mode control of a digital dead-beat DC-DC converter", in *Proc. IEEE APEC Conf.* 2004, Vol. 3, 2004 pp. 1790-1795.
[21] P. T. Krein, "Feasibility of Geometric Digital Controls and Augmentation for Ultrafast Dc-Dc Converter Response," In *Proc. IEEE Workshop Comput. Power Electron.*, 2006, pp. 48-56.
[22] G. E. Pitel, P. T. Krein, "Trajectory paths for Dc-Dc converters and limits to performance," In *Proc. IEEE Workshop Comput. in Power Electron.*, 2006, pp. 40-47.
[23] R. D. Middlebrook, "Small-signal modeling of pulse-width modulated switched-mode power converters," *Proceedings of the IEEE*, Volume 76, Issue 4, April 1988, pp. 343-354.
[24] R. D. Middlebrook, "Modeling current-programmed buck and boost regulators," *IEEE Trans. Power Electron.*, Volume 4, Issue 1, January 1989, pp. 36-52.
[25] P. T. Krein. "Nonlinear Control and Control of Chaos," *Nonlinear Phenomena in Power Electronics Attractors, Bifurcation, Chaos, and Nonlinear Control*, Wiley-IEEE Press, 2001, Chapter 8.
[26] B. J. Patella, A. Prodic, A. Zirger, and D. Maksimović, "High-frequency digital PWM Controller IC for DC-DC converters," *IEEE Trans. on Power Electron.*, Volume 18, pp. 438-446, January 2003.
[27] W. Stefanutti, P. Mattavelli, S. Saggini, and M. Ghioni, "Autotuning of Digitally Controlled DC-DC Converters Based on Relay Feedback," *IEEE Trans. Power Electron.*, Vol. 22, pp. 199-207, January 2007.
[28] B. Miao, R. Zane, and D. Maksimović, "System identification of power converters with digital control through cross-correlation methods," *IEEE Trans. Power Electron.*, Vol. 20, pp. 1093-1099, September 2005.
[29] Z. Zhao, H. Li, A. Feizmohammadi, A. Prodić, "Limit-Cycle Based Auto-Tuning System for Digitally Controlled Low-Power SMPS", in *Proc. IEEE APEC Conf.* 2006, pp. 1143-1147.

[30] Y. Tsividis. "Continuous-time digital signal processing," in *Proc. Electronics Letters*, vol. 39, pp. 1551-1552, October 2003.

[31] Y. Tsividis, "Mixed-Domain Systems and Signal Processing Based on Input decomposition", *IEEE Trans. Circ. Syst.I: Regular Papers*, [see also *IEEE Trans. Circ. Syst. I. Fundamental Theory and Applications*] Vol. 53, pp. 2145-2156, October 2006.

[32] Y. Tsividis, "Digital signal processing in continuous time: a possibility for avoiding aliasing and reducing quantization error," in *Proc. IEEE ICASSP Conf.,* 2004, Vol. 2, 17-21 May 2004, pp. 589-92.

[33] Y. Tsividis, G. Cowan, Y. W. Li, and K. Shepard, "Continuous-Time DSPs, Analog/Digital Computers and Other Mixed-Domain Circuits", *Proc. of ESSCIRC Conf.* 2005. pp. 113-116.

[34] H. P. Forghani-zadeh and G. A. Rincon-Mora, "Current-sensing techniques for DC-DC converters," in Proc. IEEE Midwest Symposium on Circuits and Systems, 2002, MWSCAS, vol. 2, pp. 577-580.

[35] Zhenyu Zhao, A. Prodić, and P. Mattavelli, "Self-Programmable PID Compensator for Digitally Controlled SMPS", In *Proc. IEEE Workshop Comput. Power Electron.,* 2006, COMPEL, pp. 112-116.

[36] Z. Zhao, Vadim Smolyakov and A. Prodic, "Continuous-Time Digital Signal Processing Based Controller for High-Frequency DC-DC Converters CTDSP", In *Proc. IEEE APEC Conf.* 2007, pp. 882-886.

[37] Chang-Gyu Hwang, "Semiconductor memories for IT era," in *Proc. IEEE ISSCC Conf.* 2002, Digest of Technical Papers, vol. 1, pp. 24-27.

[38] K. Wang, N. Rahman, Z. Lukić, and A. Prodić, "All-digital DPWM/DPFM. controller for low-power DC-DC converters," in *Proc. IEEE APEC Conf.* 2006, pp. 719-723.

[39] P. Mattavelli, G. Spiazzi, and P. Tenti, "Predictive digital control of power factor preregulators with input voltage estimation using disturbance observers," *IEEE Trans. Power Electron.*, vol. 20, pp. 140-147, January 2005.

[40] S. Saggini, W. Stefanutti, P. Mattavelli, "Digital deadbeat control tuning for dc-dc converters using error correlation," *IEEE Trans. Power Electron.*, Volume 22, Issue 4, July 2007, pp. 1566-1570.

What is claimed is:

1. A continuous-time digital controller system for regulating output of digitally controlled dc-dc switch-mode power supplies comprising:
   one or more connections to an output.
   (b) a continuous-time digit al signal processor that incorporates one or more delay cells operable to behave as memory elements and to store past data and current date and current data, said continuous-time digital signal processor being operable to process signals that are continuous in time and to perform amplitude quantization, said operation being devoid of sampling;
   (c) compensator; and
   (d) one or more controllers;
wherein one or more of the one or more controllers sense the output and transfers the output to the continuous-time digital signal processor which is operable to immediately or virtually immediately react to a deviation in the output whereby function of the continuous-time digital signal controller may switch between continuous-time and digital and this switch is passed to the compensator, which in turn controls the one or more controllers.

2. The continuous-time digital controller system of claim 1 wherein the continuous-time digital signal processor comprises an asynchronous windowed flash analog-to-digital converter; the one or more delay cells; digital logic; and one or more comparators; whereby the continuous-time digital controller is able to capture a signal created by output processing of one or more of the one or more controllers and is able to provide advantages of both continuous-time and digital functions.

3. The continuous-time digital controller system of claim 1 wherein the compensator may be a PID compensator.

4. The continuous-time digital controller system of claim 1 wherein the one or more controllers may include a SMPS controller, or two or more of the one or more controllers may function together to provide a SMPS controller function.

5. The continuous-time digital controller system of claim 1 wherein the one or more controllers may include a pulse width modulated controller.

6. The continuous-time digital controller system of claim 1 wherein output is voltage or current.

7. A continuous-time digital controller for low-power high-frequency dc-dc converters comprising:
   (a) one or more connections to an output;
   (b) a continuous-time digital signal processor operable to process signals, that are continuous in time and to perform amplitude quantization, said operation being devoid of sampling and said continuous-time digital signal processor comprising;
      (i) an asynchronous windowed flash analog-to-digital converter;
      (ii) one or more delay cells operable to behave as memory elements and to store past data and current data; and
      (iii) digital logic;
   (c) a compensator; and
   (d) one or more controllers;
wherein one or more of the one or more controllers sense the output and transfers the output to the continuous-time digital signal processor which is operable to immediately or virtually immediately react to a deviation in the output whereby function of the continuous-time digital signal controller may switch between continuous-time and digital and this switch is passed to the compensator, which in turn controls the one or more controllers.

8. A dual-mode controller system comprising system two modes of function and comprising:
   (a) conventional PID regulator;
   (b) a continuous-time digital signal processor that incorporates one or more delay cells operable to behave as memory elements and to store past data and current data;
   (c) a monitoring means that monitors an input feed on an on-going basis and affects two modes of function of the dual-mode controller system, said two modes of function including;
      (i) a steady state, being operable to cause the conventional PID regulator to be used to obtain tight output regulation; and
      (ii) a dynamic state, being operable to cause a continuous-time digital signal processor principle to be utilized for achieving optimum control by the continuous-time digital signal processor that is operable to process signals that are continuous in time and to perform amplitude quantization, said operation being devoid of sampling; and
   (d) a controller operable to apply a mode-switch immediately or virtually immediately when a deviation in the input feed is recognized by the monitoring means whereby the, steady state is replaced by tile dynamic state which activates the mode-switch.

9. A dual-mode controller system of claim 8 wherein the input feed is a voltage or current.

10. A dual-mode controller system of claim 8 herein the monitoring means comprises:
   (a) one or more comparators; and
   (b) digital logic;
whereby sudden changes in the input feed causes the dynamic state to occur wherein processing occurs by the one or more comparators based upon the digital logic whereby a switch-mode of a power supply of the controller is applied.

* * * * *